US005508222A

United States Patent [19]
Sakao

[11] Patent Number: 5,508,222
[45] Date of Patent: Apr. 16, 1996

[54] FABRICATION PROCESS FOR SEMICONDUCTOR DEVICE

[75] Inventor: Masato Sakao, Tokyo, Japan

[73] Assignee: NEC Corporation, Tokyo, Japan

[21] Appl. No.: 357,218

[22] Filed: Dec. 13, 1994

[30] Foreign Application Priority Data

Dec. 13, 1993  [JP]  Japan ................... 5-311407

[51] Int. Cl.⁶ ................................................ H01L 21/70
[52] U.S. Cl. ................ 437/60; 437/47; 437/52; 437/919
[58] Field of Search .................... 437/52, 48, 919, 437/60, 47

[56] References Cited

U.S. PATENT DOCUMENTS

| | | | |
|---|---|---|---|
| 5,084,405 | 1/1992 | Fazan et al. | 437/48 |
| 5,126,280 | 6/1992 | Chan et al. | 437/52 |
| 5,150,276 | 9/1992 | Gonzalez et al. | 437/52 |
| 5,266,512 | 11/1993 | Kirsch | 437/919 |
| 5,330,614 | 7/1994 | Ahn | 437/60 |

FOREIGN PATENT DOCUMENTS 4-264767  9/1992  Japan.

OTHER PUBLICATIONS

"Crown-Shaped Stacked-Capacitor Cell for 1.5-V Operation 64-Mb DRAM's," by Toru Kaga et al., IEEE Transactions on Electron Devices, vol. 38, No. 2, Feb. 1991, pp. 255–261.

Primary Examiner—Tuan H. Nguyen
Attorney, Agent, or Firm—Popham, Haik, Schnobrich & Kaufman

[57] ABSTRACT

In a fabrication process for a semiconductor device, a core member is projected from a lower electrode layer and an insulation layer on a semiconductor substrate. Outer groups of cylindrical electrodes extending from the lower electrode layer are coaxially located around the core member. Thereafter, the core member is removed. With a space defined by removal of the core member, inner groups of cylindrical electrodes are formed utilizing the outer cylindrical electrodes and spacers therebetween as a united spacer defining an outer perimeter. The lower electrode layer, and the outer and inner groups of cylindrical electrodes form the lower electrodes of a capacitor in a memory call.

11 Claims, 14 Drawing Sheets

FIG. IF (PRIOR ART)
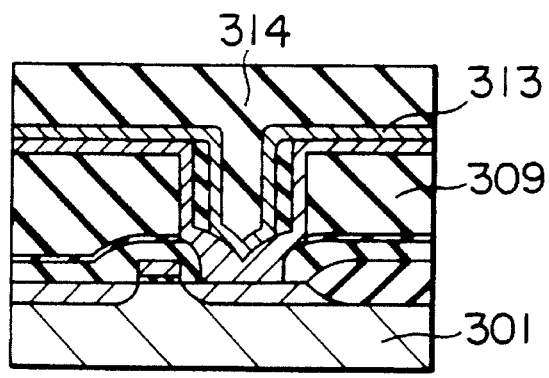
FIG. IG (PRIOR ART)
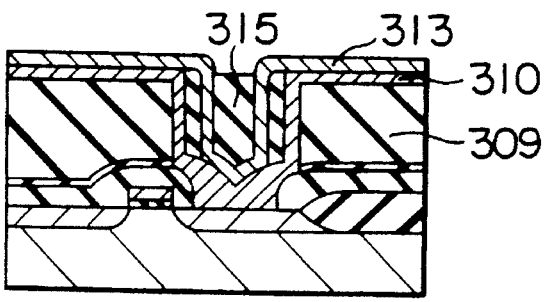
FIG. IH (PRIOR ART)
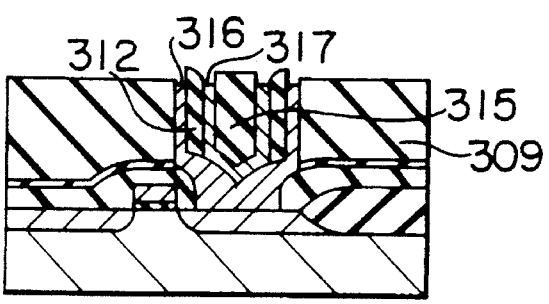
FIG. II (PRIOR ART)
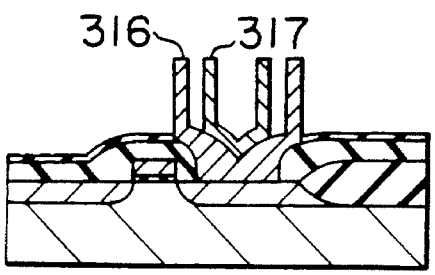
FIG. IJ (PRIOR ART)
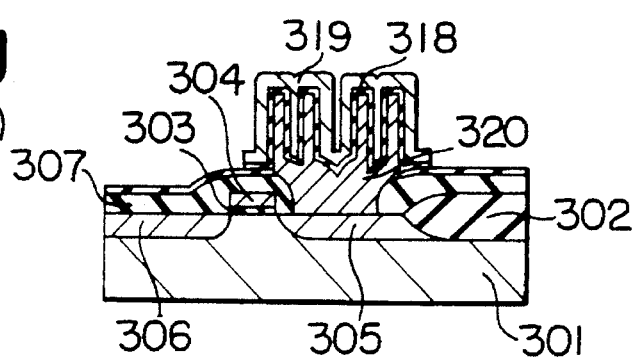

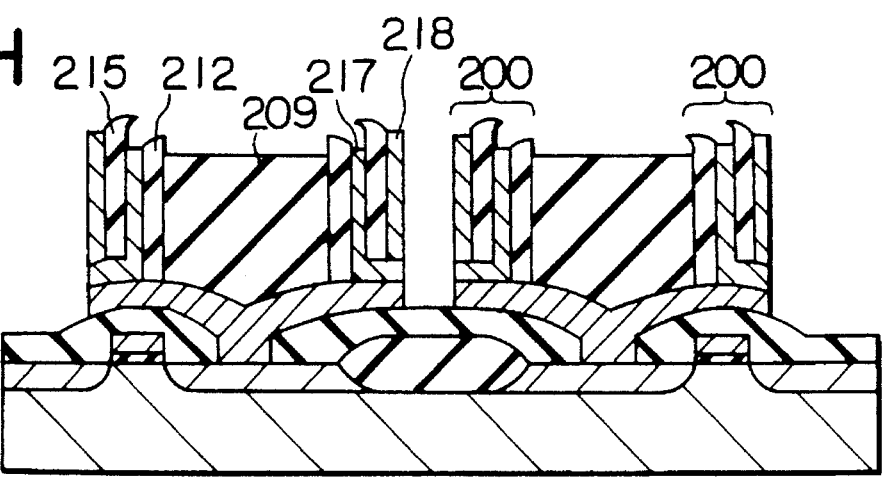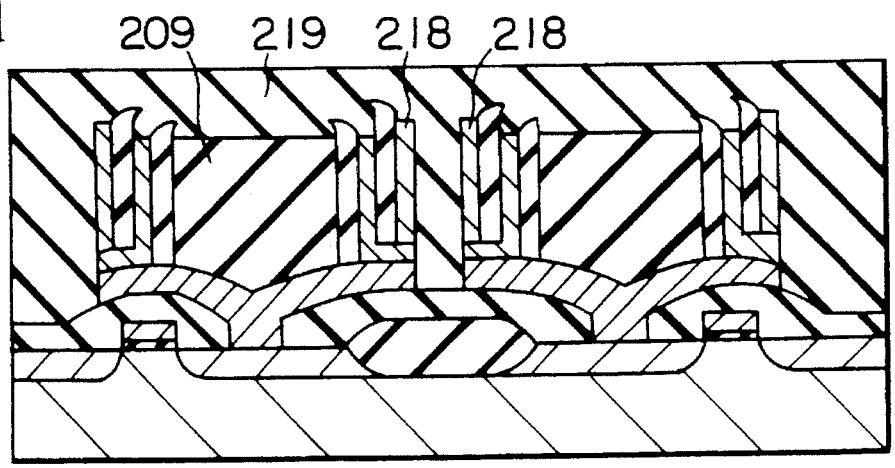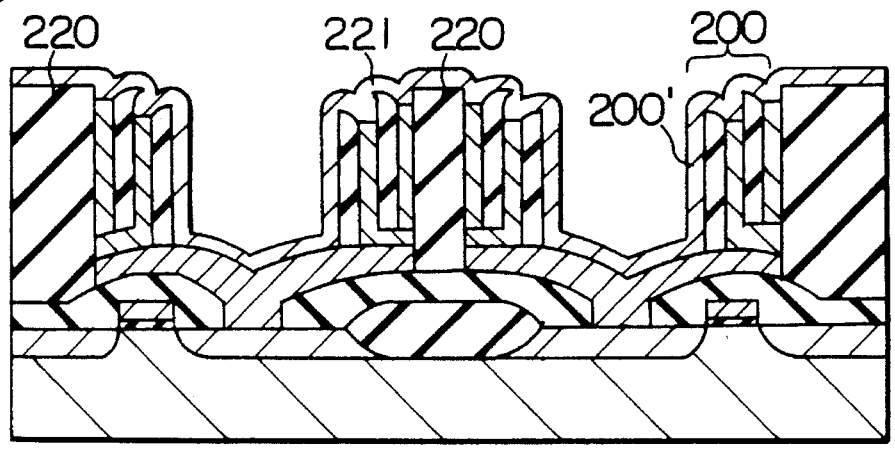

FABRICATION PROCESS FOR SEMICONDUCTOR DEVICE

BACKGROUND OF THE INVENTION

1. Field of the Invention

The present invention relates generally to a fabrication process for a semiconductor device, and more particularly to a fabrication process for a semiconductor memory device.

2. Description of the Related Art

A memory cell consisted of one transistor and one capacitor as a memory cell for a high density semiconductor memory, which will be hereinafter simply referred to as "memory cell", has been widely employed for small number of components and for ease of reduction of a memory cell area.

As is well known, the output voltage of such memory cell is proportional to a capacity of the capacitor. Therefore, in order to assure stable operation at reduced size and increased package density of the memory cells, it is required to provide sufficient capacity for the capacitor. As the conventional capacitor of this type, there is a memory cell and fabrication process therefor disclosed in IEEE TRANSACTIONS OF ELECTRON DEVICES Vol. 38, 1991, pp 255 to 261.

FIG. 1J shows the construction disclosed in the above-identified IEEE paper. On the surface of a silicon substrate 301 defined with a field oxide layer 302, a gate electrode 304 is provided via a gate oxide layer 303. A source (or drain) region 305 and a drain (or source) region 306 are provided at both sides of the gate electrode 304. On the surface of an insulation layer 307 covering the gate electrode 304, the source region 305 and the drain region 306, a multi-cylindrical electrode 320 connected to the source region 305 is formed. A capacitor is formed by forming an upper electrode 319 via a multi-cylindrical type capacitor insulation layer 318 (dielectric layer) covering the multi-cylindrical electrode 320.

The multi-cylindrical type capacitor having the construction as set forth above is fabricated through the processes as illustrated in FIGS. 1A to 1J.

At first, as shown in FIG. 1A, the field oxide layer 302 is formed on the P-type silicon substrate 301 by selective oxidation, so-called LOCOS method. Then, the gate electrode 304 of a conductive polycrystalline silicon layer is formed via the gate oxide layer 303 by way of chemical vapor deposition (CVD) method. Then, by ion implantation, the source region 305 and the drain region 306 or vice versa are formed. Over the surfaces of the gate electrode 304, the source region 305 and the drain region 306, the insulation layer 307 in a thickness of approximately 300 nm of silicon oxide layer is formed. Subsequently, by the CVD method, a silicon nitride layer 308 is deposited over the insulation layer 307.

As shown in FIG. 1B, a thick silicon oxide layer 309 is deposited over the silicon nitride layer 308 by way of the CVD method. Then, an opening 307a reaching the source region 305 is formed through the first silicon oxide layer 309, the silicon nitride layer 308, the insulation layer 307.

Then, as shown in FIG. 1C, a conductive first polycrystalline silicon layer 310 is formed on the surface including the peripheral surface of the opening 307a is deposited by the CVD method. Thereafter, as shown in FIG. 1D, by way of the CVD method, a second silicon oxide layer 311 is formed over the surface of the first polycrystalline silicon layer 310. By anisotropic etching of the second silicon oxide layer 311, a first spacer 312 is formed at the side surface of the opening 307a, as shown in FIG. 1E. Subsequently, over the entire surface including the surface of the first spacer 312, a conductive second polycrystalline silicon layer 313 is deposited by way of the CVD method.

At this condition, as shown in FIG. 1F, a thick third silicon oxide layer 314 is deposited to cover the vertical portion of the second polycrystalline silicon layer 313 by the CVD method.

Next, dry etching for the third silicon oxide layer 314 is performed to maintain the third silicon oxide layer 314 only on the vertical portion of the second polycrystalline silicon layer 313 to bury so that it should not be left on the surface portion. By this process, a second spacer 316 is formed as shown in FIG. 1G.

At this condition, anisotropic etching is performed for etching back the first and second polycrystalline silicon layers 310 and 313 to remove and to form a first cylindrical electrode 316 with the first polycrystalline silicon layer 310 and a second cylindrical electrode 317 with the second polycrystalline silicon layer 313. Also, the upper portion of the first and second spacers 312 and 315 are exposed as shown in FIG. 1H.

Next, as shown in FIG. 1I, wet etching is simultaneously performed with employing hydrofluoric acid solution for the first and second spacers 312, 315 and the first silicon oxide layer 309 for removal. By this, a multi-cylindrical lower electrode consisting of the first cylindrical electrode 316 and the second cylindrical electrode 317 are formed.

Finally, over the entire surfaces of the first and second cylindrical electrodes 316 and 317, a capacitor insulation layer 318 is formed.

In this prior art, tantalum oxide layer ($Ta_2O_6$ film) having higher dielectric constant than normal silicon nitride layer and the silicon oxide layer is employed as the capacitor insulation layer 318 for providing sufficient capacity for the capacitor. Therefore, a tungsten film formed by spattering is employed as the upper electrode 319.

By the fabrication process as set forth above, a desired capacity can be attained within a small memory cell area by permitting formation of the double cylindrical electrode.

The prior art illustrated and discussed in connection with FIGS. 1A to 1J, is adapted to form the multi-cylindrical structure within the opening 307a of the first oxide layer 309a formed through a photoresist process.

On the other hand, Japanese Unexamined Patent Publication No. 4-264767 discloses a fabrication process of a multi-cylindrical structure. The disclosed fabrication process will be discussed hereinafter with reference to FIGS. 2A to 2K.

The final capacitor structure has three cylindrical electrode including a first cylindrical layer 417, a second cylindrical layer 418 and a third cylindrical layer 419 in a lower electrode layer 408 to form a lower electrode, as shown in FIG. 2K. On the surface of the lower electrode, a capacitor insulation layer 421 is formed, and an upper electrode 422 is formed over the capacitor insulation layer 421.

In the fabrication process, at first, on the surface of a P-type silicon substrate 401, a field oxide layer 402 is selectively formed. In an element region, a gate electrode 404 is formed via a gate oxide layer 403. A source (or drain) region 405 and a drain (or source) region 406 are provided at both sides of the gate electrode 304. Then, an insulation layer 407 covering the gate electrode 404, the source region 405 and the drain region 406 is formed.

As shown in FIG. 2B, by employing normal photo-lithographic technique and dry etching technique, an opening 407a reaching to the source (or drain) region 405 is formed. On the entire surface including the surface of the opening 407a, a conductive polycrystalline silicon film is deposited by the CVD method to form the electrode layer 408. (FIG. 2B).

Subsequently, as shown in FIG. 2C, over the lower electrode layer 408, a silicon oxide layer is deposited by the CVD method. By performing patterning employing the normal photo-lithographic technique of the silicon oxide layer, a first spacer layer 409 is formed.

Then, as shown in FIG. 2D, a conductive first polycrystalline silicon layer 410 is formed on the first spacer layer 409 and the lower electrode layer 408 by way of the CVD method.

Next, as shown in FIG. 2E, by employing CVD method, the first silicon oxide layer 411 is deposited. Subsequently as shown in FIG. 2F, an isotropic etching is performed for the first silicon oxide layer 411 employing an RIE method to form a second spacer 412 only at the side surface of the first spacer 409.

Then, as shown in FIG. 2G, on the surface of the second polycrystalline silicon layer 413, a second silicon oxide layer 414 is deposited by way of the CVD method.

Subsequently, as shown in FIG. 2H, by employing the RIE method, anisotropic etching is performed for the second silicon oxide layer 414 to form into the configuration of a third spacer 415. Then, by employing the CVD method, a conductive third polycrystalline silicon layer 416 is formed on the surface of the second polycrystalline silicon layer 413 including the third spacer layer 415.

As shown in FIG. 2I, anisotropic etching is performed by the RIE method for the first, second and third polycrystalline silicon layers 410, 413 and 416 and the lower electrode layer 408, simultaneously to expose the upper portions of the first, second and third spacers 409, 412 and 415. By this, the first, second and third cylindrical electrodes 417, 418 and 419 as the lower electrode are formed and the lower electrode 408 is thus formed.

Subsequently, the first, second and third spacers 409, 412 and 415 are removed by way of wet etching employing a hydrofluoric acid solution to obtain the structure as illustrated in FIG. 2J.

Finally, as shown in FIG. 2K, over the entire surfaces of the first, second and third cylindrical electrodes 417, 418 and 419 which are exposed as set forth above and the lower electrode layer 408, a capacitor insulation layer 421 formed of a silicon nitride layer is formed. Over the entire surface of the silicon nitride layer 421, an upper electrode 422 of the conductive polycrystalline silicon is deposited by the CVD method.

Through the fabrication process set forth above, the triple cylindrical electrode can be formed.

However, in the foregoing method, when a greater capacity is desired to be provided for the small memory cell and thus greater number of cylindrical electrodes than the triple cylindrical electrode, it becomes inherent to reduce the size of the first spacer 409 as a core of the first cylindrical electrode 417, to make the layer thicknesses of respective cylindrical layers thinner and/or to reduce the clearances between respective cylindrical electrodes.

When the cross-sectional area of the first spacer 409 is reduced, a pattern may be deformed in the patterning step causing difficulty in the formation of the first spacer 409 through etching process. Also, the configuration of the first spacer 409 becomes a somewhat tapered configuration. Such a tapered configuration is not suitable configuration for performing RIE anisotropic etching for forming the first cylindrical electrode 417 as the side wall of the first spacer. In particularly, for a multi-cylindrical structure, the taper may be increased at the outer side electrode to make the formation of the side wall when the cylindrical electrode is formed utilizing the side wall formed by the inner side spacer layer. It is thus possible that formation of the side wall per se becomes impossible at a significant taper angle to make fabrication of the cylindrical electrodes impossible.

For instance, in case of a 64 Mbit class DRAM having design dimensions of 0.35 μm has been considered to be limited at the triple-cylindrical structure as in the prior art set forth above. On the other hand, when a plurality of cylindrical electrodes are formed sequentially, it is likely that the thickness of the electrode at an outer side becomes greater and the height thereof becomes lower at the outer side electrode. Therefore, contribution for the effective capacity becomes smaller at the outer cylindrical electrode thereby degrading the effect of the multi-cylindrical structure.

In case of the first discussed prior art illustrated and discussed in connection with FIGS. 1A to 1J, the spacer portion (to be employed as the spacer for forming the inner first cylindrical electrode 316) illustrated as the first silicon oxide layer 309 in FIG. 1B is formed with the cylindrical electrode at the inside thereof so as not to be used as the capacity portion. Therefore, the first silicon oxide layer 309, i.e. the space portion, serves as a dead space not to be used as the capacity portion.

Also, in the case where the spacer is provided inside of the cylindrical electrode, there is a limit for down-sizing the space to obtain a suitable cylindrical electrode configuration. Therefore, the number of cylinders to form the multi-cylinder construction is limited.

Furthermore, the problem that, in the multi-cylindrical structure, the outer side cylindrical electrode has lower height than the inner side cylindrical electrode is inherent.

SUMMARY OF THE INVENTION

Therefore, it is an object of the present invention to solve the foregoing problems in the conventional cylindrical electrode fabrication process and to provide a fabrication method for a capacitor which permits a plane area on a memory cell to be used as a capacitor portion to increase capacity.

According to the present invention, a fabrication process for a semiconductor device comprises the steps of: forming a projecting core member on a lower electrode layer provided on the surface of an insulation layer on a semiconductor substrate; forming outer electrode bodies through forming spacer layers and conductive layers alternately on the outer wall of said core member, and forming cylindrical electrodes extending from said lower electrode layer from said conductive layers and spacers between said cylindrical electrodes from said spacer layers, by anisotropic etching; removing said core member; forming inner electrode bodies through forming spacer layers and conductive layers alternately on the inner wall of said outer electrode bodies at a portion where said core member is removed, and forming cylindrical electrodes extending from said lower electrode layer from said conductive layers and spacers between said cylindrical electrodes from said spacer layers, by anisotropic etching, for forming a lower electrode with said lower electrode layer, said outer electrode bodies and said inner electrode bodies; removing spacers from said outer and inner electrode bodies; and forming a capacitor insulation layer over the exposed surfaces of said lower electrode consisted of said lower electrode layer and said cylindrical electrodes, and forming an upper electrode over said capacitor insulation layer to form a capacitor.

According to the present invention, in order to fabricate a semiconductor device having the largest possible number of coaxially arranged cylindrical electrodes, a spacer (core member) to be a core in formation of the cylindrical electrodes is initially arranged at the center. A conductive layer is deposited over the core spacer and a spacer layer is deposited over the conductive layer. Then, an anisotropic etching is performed for forming a spacer from the spacer layer. After repeating this process for a plurality of times, the upper portions of the conductive layers are removed. Subsequently, the core spacer is removed and the foregoing processes are repeated. After removal of upper portions of the latter formed conductive layers, all of the spacers are removed simultaneously. Then, a capacitor insulation layer (capacitor dielectric layer) is formed over the side walls after removal of the spacer and the lower electrode layer. Then, an upper electrode is formed thereover. Thus, a substantially maximum number of cylindrical electrodes can be arranged in a region of a memory cell without forming a dead space to provide a large capacity for a down-sized memory cell.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIGS. 1A to 1J are sections showing a process steps in the conventional semiconductor fabrication process;

DETAILED DESCRIPTION OF THE PREFERRED EMBODIMENTS

The present invention will be discussed in detail in terms of the preferred embodiments of the present invention with reference to FIGS. 3 and 4A to 4O. In the following description, numerous specific details are set forth in order to provide a thorough understanding of the present invention. It will be obvious, however, to those skilled in the art that the present invention may be practiced without these specific details. In other instances, well-known structures are not shown in detail in order not to unnecessarily obscure the present invention.

Figure 1A:
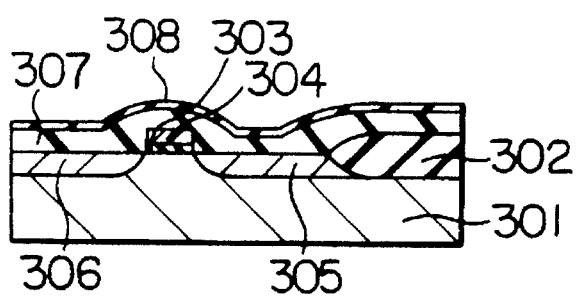
Figure 1B:
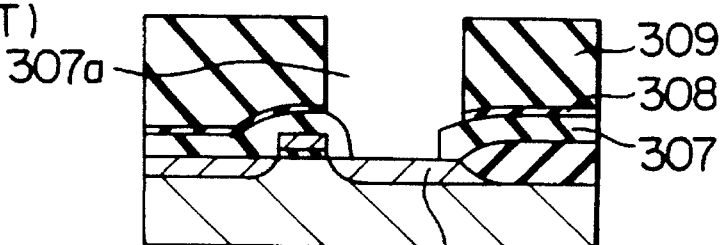
Figure 1C:
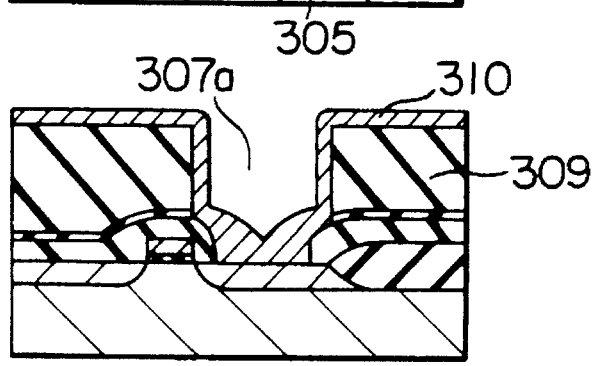
Figure 1D:
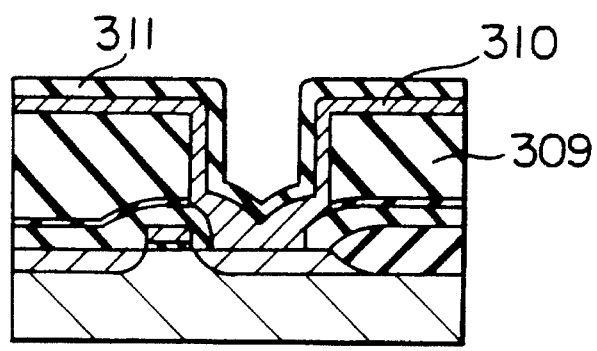
Figure 1E:
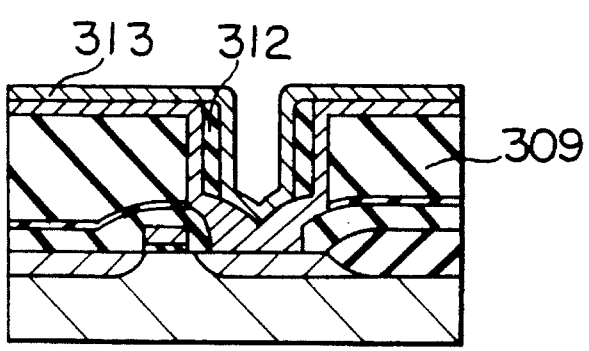
Figure 2A:
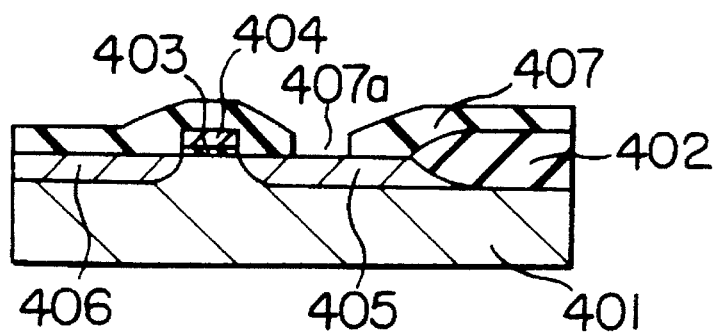
FIGS. 2A to 2K are sections showing the process steps in another conventional semiconductor device fabrication process.
Figure 2B:
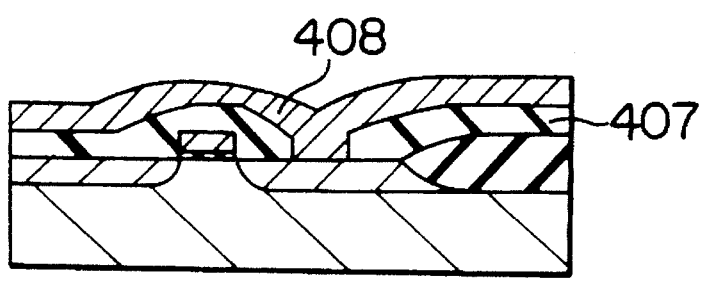
Figure 2C:
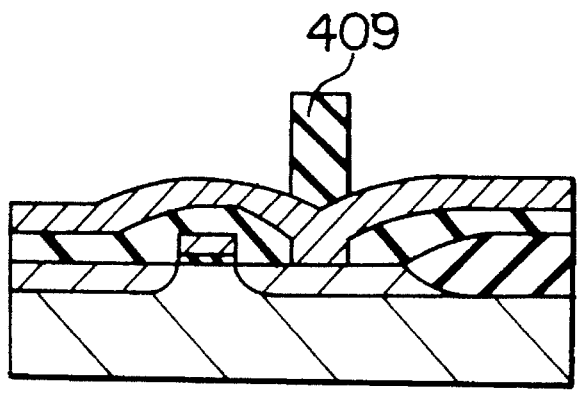
Figure 2D:
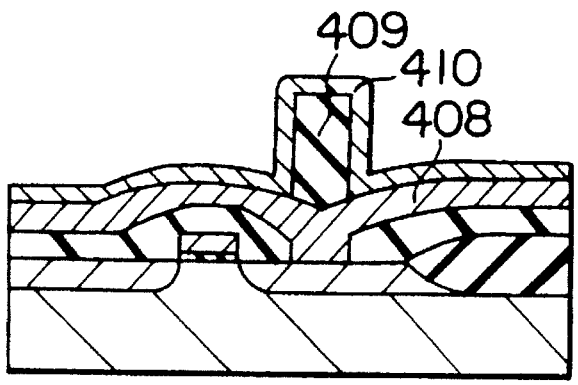
Figure 2E:
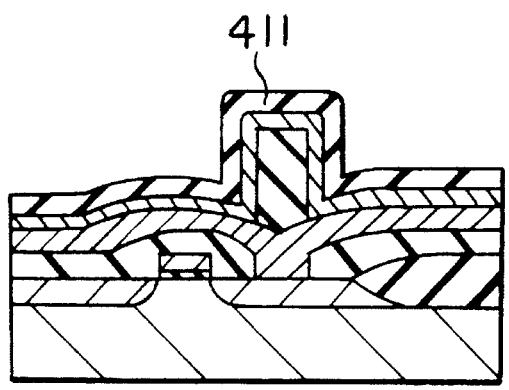
Figure 2F:
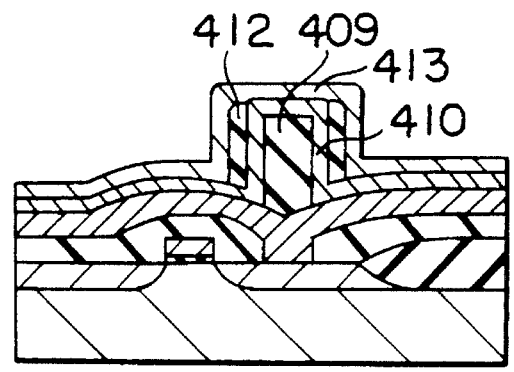
Figure 2G:
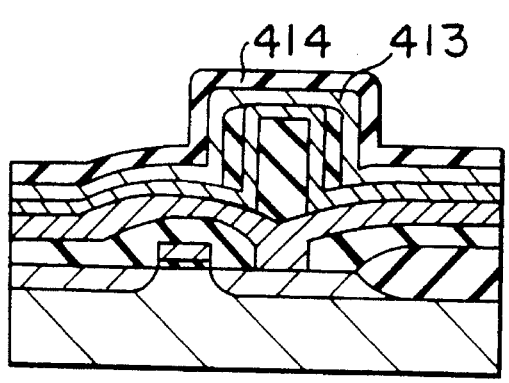
Figure 2H:
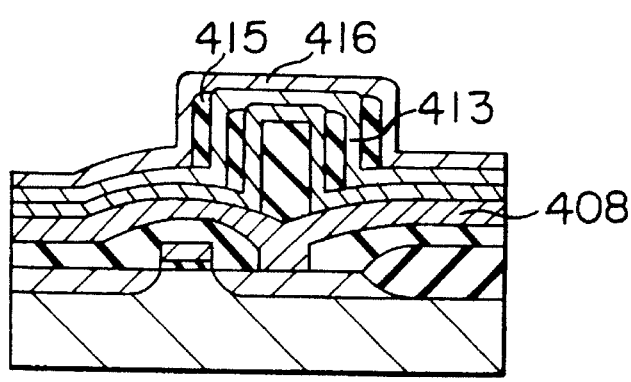
Figure 2I:
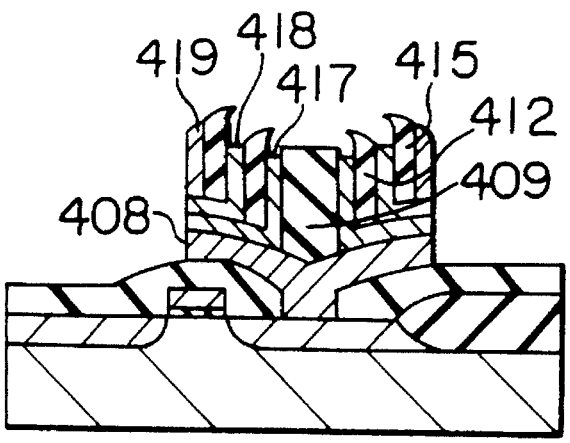
Figure 2J:
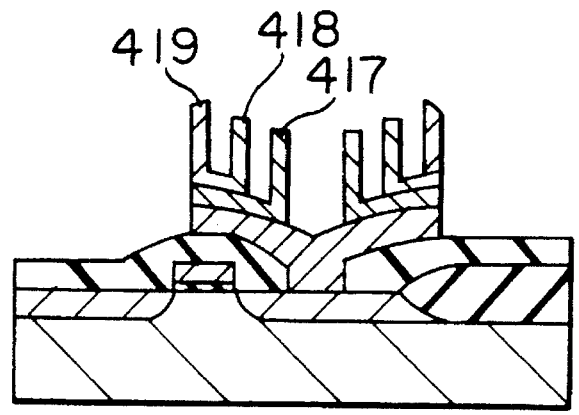
Figure 2K:
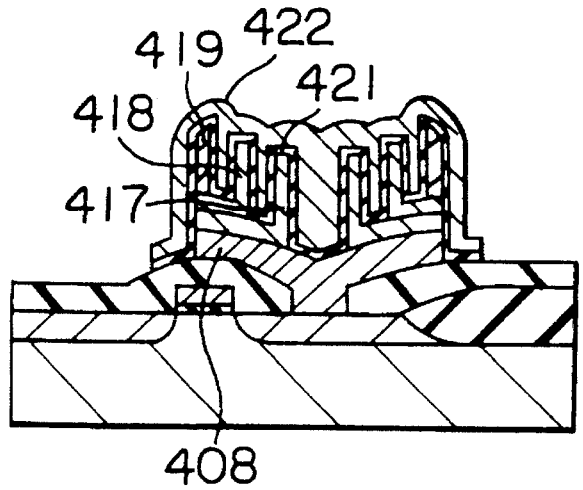
Figure 3:
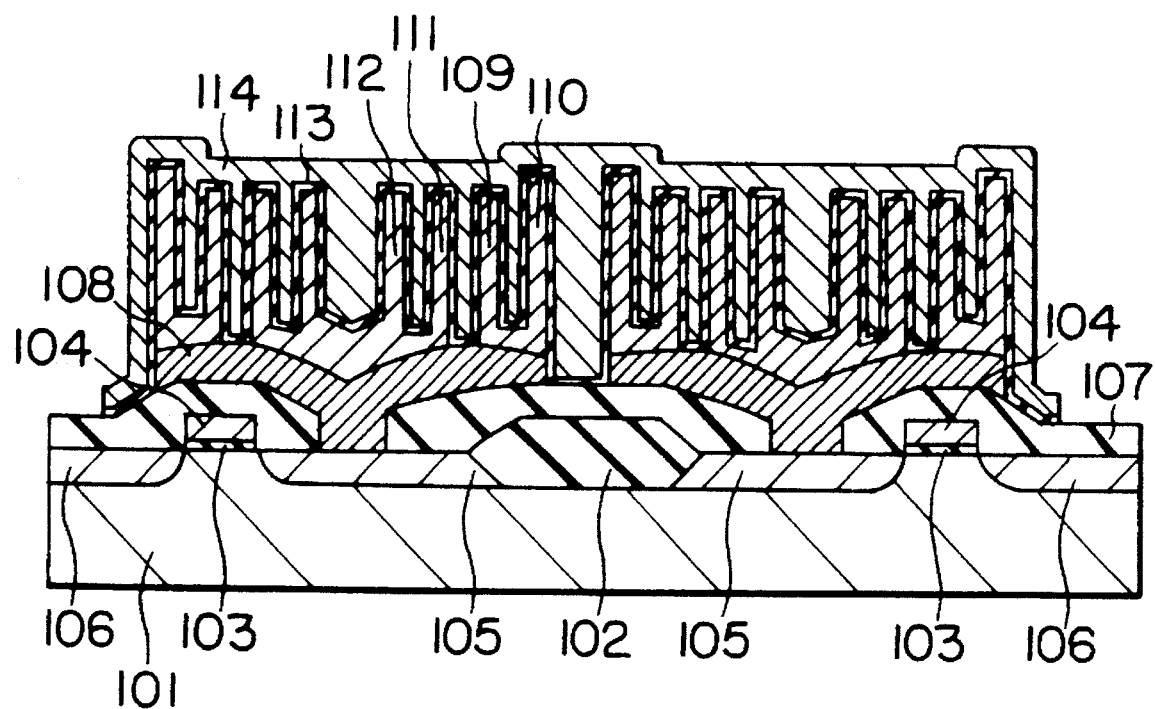
FIG. 3 is a section showing a structure of a memory cell fabricated through the first embodiment of a fabrication process according to the present invention.

At first, FIG. 3 illustrates a section of a capacitor obtained by application of the first embodiment of the semiconductor device fabrication method according to the present invention. On the surface of a P-type silicon substrate 101 fixed with a field oxide layer 102, a gate electrode 104 is formed via a gate oxide layer 103. A source (or drain) region 105 and a drain (or source) region 106 are provided at both sides of the gate electrode 104. On the surface of an insulation layer 107 covering the gate electrode 104, the source region 105 and the drain region 106, a lower electrode layer 108 is formed and shaped. On the lower electrode layer 108, a multi-cylindrical electrode consists of a first cylindrical electrode 109, a second cylindrical electrode 110, a third cylindrical electrode 111 and a fourth cylindrical electrode 112 is formed. The lower electrode layer 108 and the first to fourth cylindrical electrodes 109, 110, 111 and 112 form a lower electrode of a capacitor. By forming an upper electrode 114 over the surfaces of the cylindrical electrodes and the lower electrode layer via a capacitor insulation layer (capacitor dielectric layer), the capacitor is formed. The lower electrode layer 108 of the capacitor is connected to the source (or drain region) 105 of the transistor to form a memory cell of DRAM.

Hereinafter, the first embodiment of the fabrication process for the capacitor will be discussed with reference to FIGS. 4A to 4O and FIGS. 5 to 7. It should be noted that respective section (FIGS. 4A to 4O) shows an example of two memory cells and respective plan views (FIGS. 5 to 7) show examples of four memory cells.

Figure 4A:
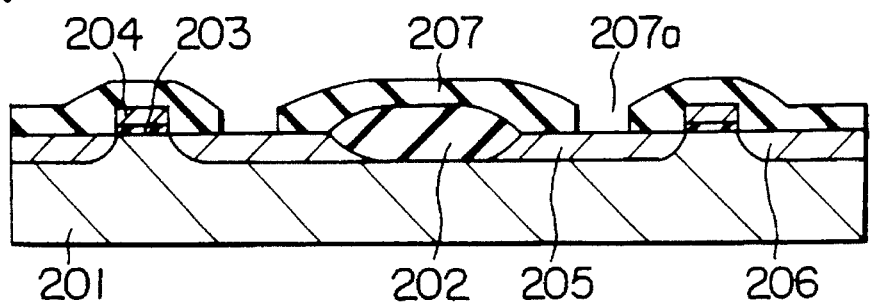
FIGS. 4A to 4O are sections showing process steps in the first and second embodiment of semiconductor device fabrication process according to the present invention.

At first, as shown in FIG. 4A, similarly to the prior art method, the field oxide layer 202 is formed on the P-type silicon substrate 201 by selective oxidation, so-called LOCOS method. Then, the gate electrode 204 of a conductive polycrystalline silicon layer is formed via the gate oxide layer 203 by way of chemical vapor deposition (CVD) method. Then, by ion implantation, the N-type source region 205 and the drain region 206 or vice versa are formed. Over the surfaces of the gate electrode 204, the source region 205 and the drain region 206, the insulation layer 207 of silicon oxide layer is formed. By employing the reactive ion etching (RIE) method for photo-lithographic technology, an opening 207a reaching to the source (or drain) region 205 is formed through the insulation layer 207.

Figure 4B:
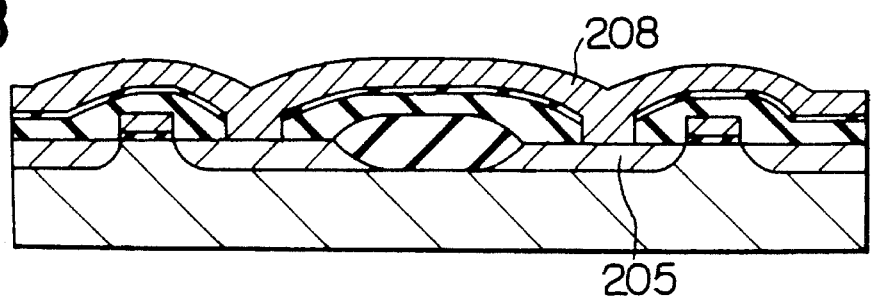

As shown in FIG. 4B, a lower electrode layer 208 of a conductive polycrystalline silicon layer is formed by way of the CVD method so that the lower electrode layer 208 is connected to the source (or drain) region 205 via the opening 207a.

Figure 4C:
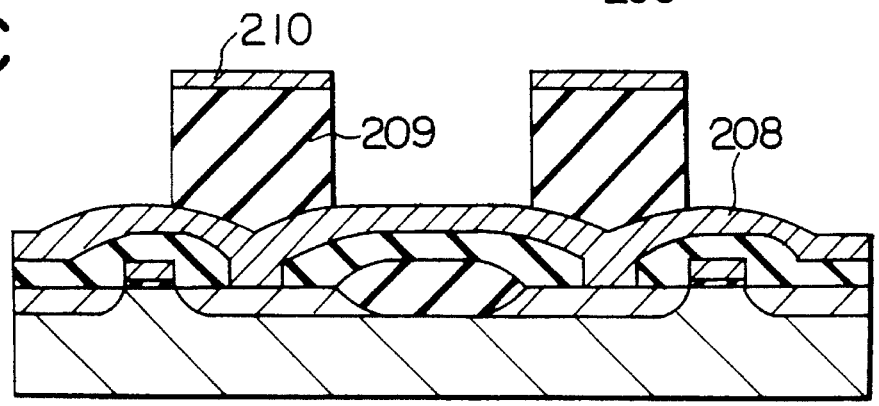
Figure 5:
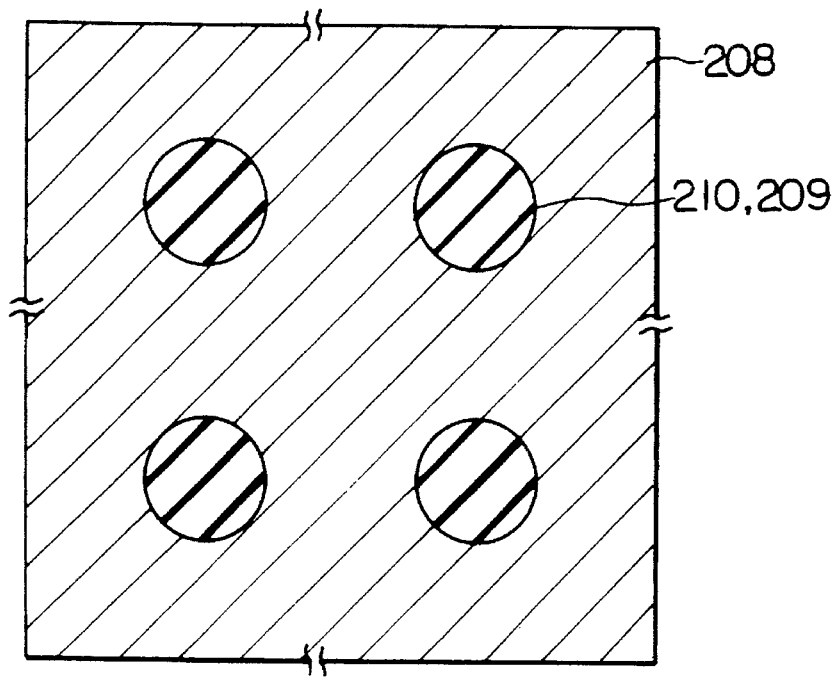
FIG. 5 is a plan view in the process step of FIG. 4C.

Subsequently, as shown in FIG. 4C, on the lower electrode layer 208, a silicon oxide layer and a polycrystalline silicon layer are deposited in order using the CVD method. Then, by performing dry etching with the RIE method, a core member of a coaxially arranged cylindrical electrode structure of a mask polycrystalline silicon layer 210 and a core silicon oxide layer 209 is formed at the center of the portion where the cylindrical electrodes are arranged. The plan view of the process step of FIG. 4C is shown in FIG. 5.

Figure 4D:
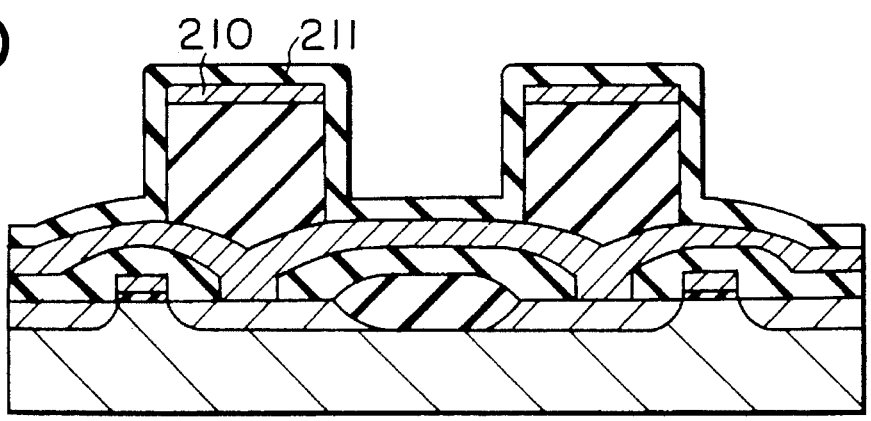
Figure 4E:
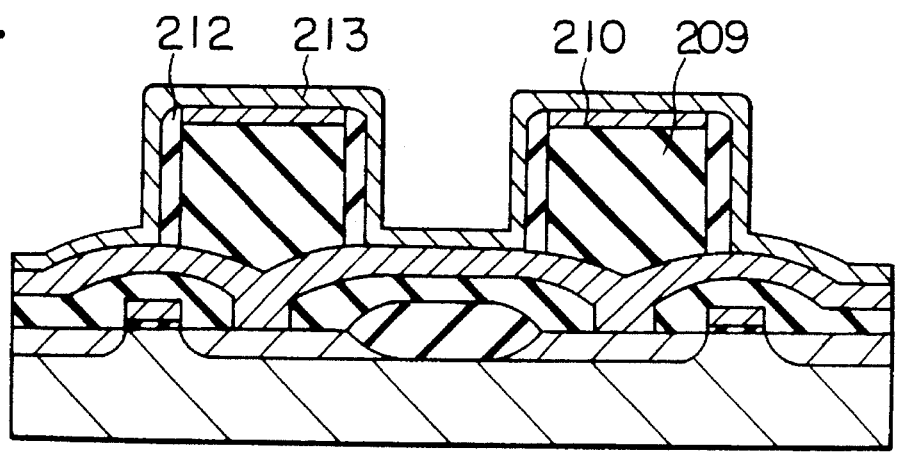

Subsequently, as shown in FIG. 4D, a first silicon nitride layer 211 is deposited over the entire surface including the side wall portion of the mask polycrystalline layer 210 and the core silicon oxide layer 209. An anisotropic etching by the RIE method is performed for the first silicon nitride layer 211 to leave the side wall of the core member consisted of the mask polycrystalline silicon layer 210 and the core silicon oxide layer 209, as shown in FIG. 4E. By this, a first spacer 212 is formed. Thereafter, by employing the CVD method, a conductive first polycrystalline silicon layer 213 is deposited.

Figure 4F:
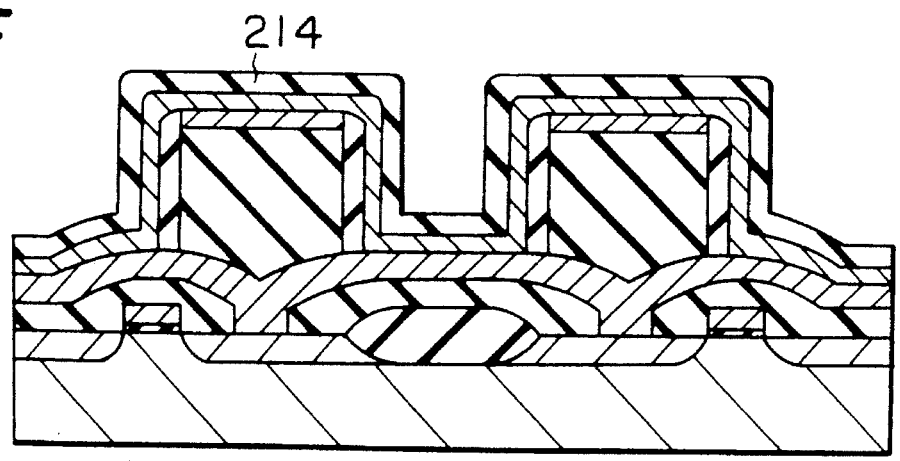

Subsequently, as shown in FIG. 4F, a second silicon nitride layer 214 is deposited over the entire surface of the first polycrystalline silicon layer 213.

Figure 4G:
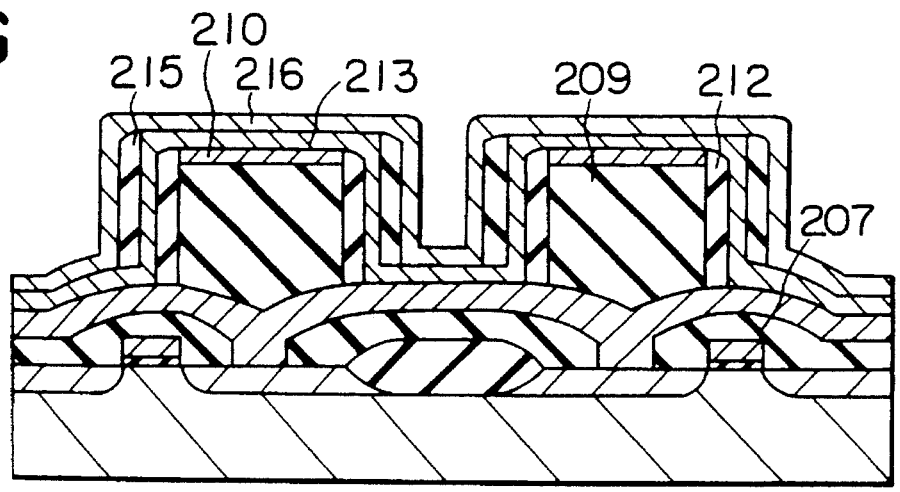

Next, as shown in FIG. 4G, anisotropic etching employing the RIE technology is performed for the second silicon nitride layer 214 so as to leave only the side wall portion of the second silicon nitride layer 214 to form a second spacer 215 similarly to the first spacer 212. A second polycrystalline silicon layer 216 is deposited over the entire surface including the side wall of the second spacer 215 by way of the CVD method.

Figure 6:
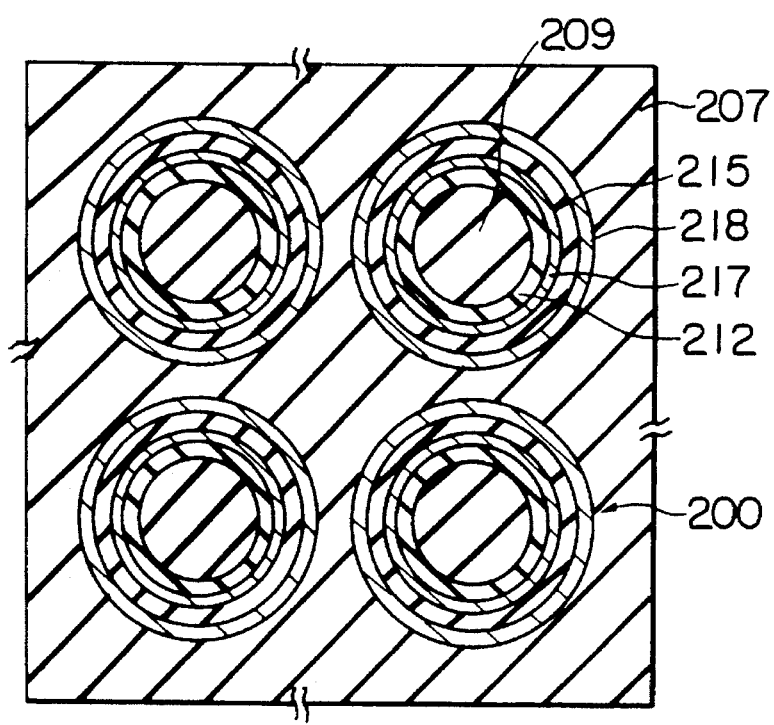
FIG. 6 is a plan view in the process step of FIG. 4H.

At this condition, as shown in FIG. 4H, by employing the RIE technology, anisotropic etching is performed simultaneously for the second polycrystalline silicon layer 216, the first polycrystalline silicon layer 213 and the mask polycrystalline silicon layer 210 to expose the upper portions of the insulation layer 207, the core silicon oxide layer 209 and the first and second spacers 212 and 215. By this process steps, the first and second polycrystalline silicon layers 213 and 216 are processed into the first and second cylindrical electrodes 217 and 218 to form an external coaxially arranged cylindrical electrode body 200. The plan view at the condition in the process steps of FIG. 4H is illustrated in FIG. 6.

Next, as shown in FIG. 4I, by way of the CVD method, a third silicon nitride layer 219 is deposited so that a clearance to the adjacent second cylindrical electrode 213 in the memory cell can be completely filled.

Then, as shown in FIG. 4J, by employing the RIE technology, etching is performed for the portion of the third silicon nitride layer 219 exposed to the upper surface of the core silicon oxide layer 209. Subsequently, wet etching with hydrofluoric acid solution is performed for the core silicon oxide layer 209 to remove the latter completely. Then, leaving the portion adjacent the second cylindrical electrode 218 and located outside of the latter, the third silicon nitride layer 219 is etched to form the third spacer 220. Thereafter, a third polycrystalline silicon layer 221 is deposited by way of the CVD method to cover the entire surface including a recessed portion defined by removal of the core silicon oxide layer 209 and the inner wall surface 200' of the external coaxially arranged cylindrical electrode body 200.

Figure 4K:
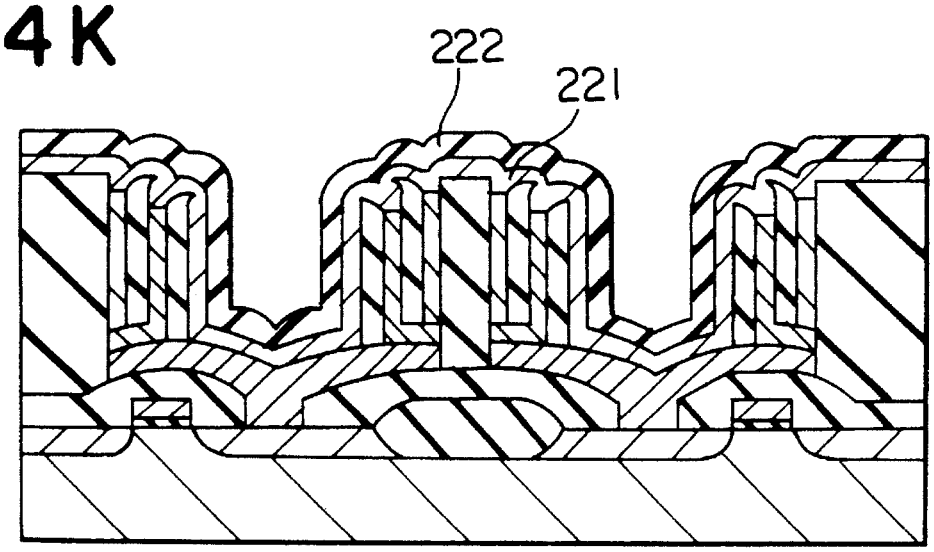

Subsequently, as shown in FIG. 4K, a fourth silicon nitride layer 222 is formed over the surface of the third polycrystalline silicon layer 221.

Figure 4L:
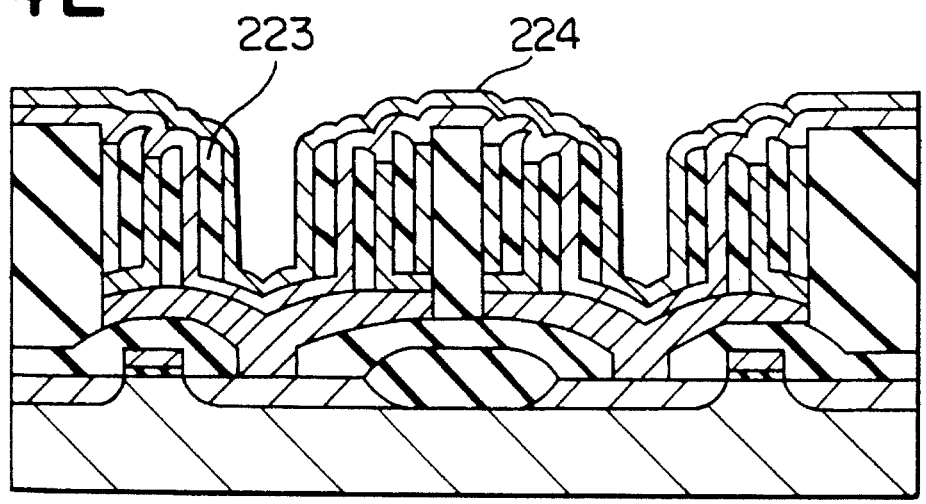

Then, as shown in FIG. 4L, anisotropic etching back is performed employing the RIE technology for the fourth silicon nitride layer 222 to form the fourth spacer 223 only on the side wall of the third polycrystalline silicon layer 221. Thereafter, by way of the CVD method, a conductive fourth polycrystalline silicon layer 224 is deposited so that the fourth polycrystalline silicon layer 224 is deposited even over the side wall of the fourth spacer 223.

Figure 4M:
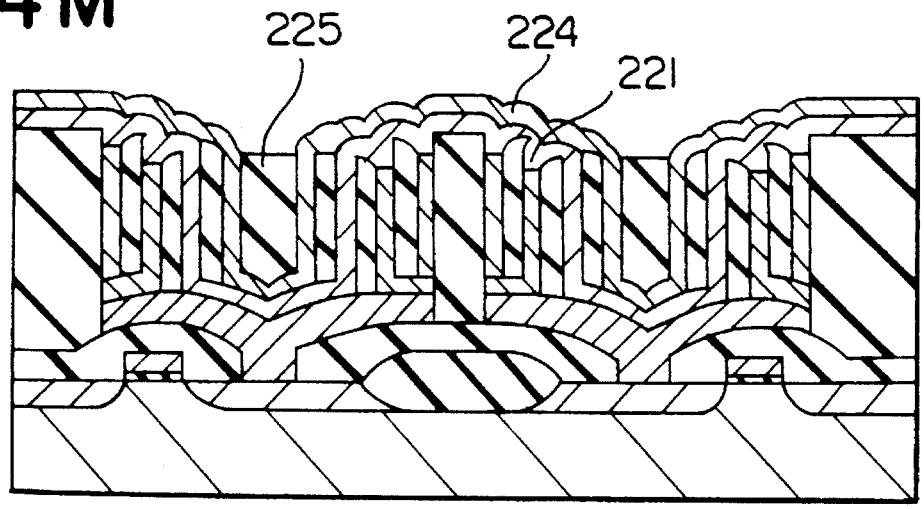

Following to this, as shown in FIG. 4M, employing the similar method to form the fourth spacer 223, a silicon nitride layer is deposited by the CVD method to form a fifth spacer 225 in such a manner that the vertical portion of the fourth polycrystalline silicon layer 224 is buried with the fifth spacer 225 completely. This fifth spacer 225 is intended to avoid damaging of the surface portion of the polycrystalline silicon layers of the lower electrode upon formation of the third and fourth cylindrical electrodes by way of the anisotropic etching.

Figure 4N:
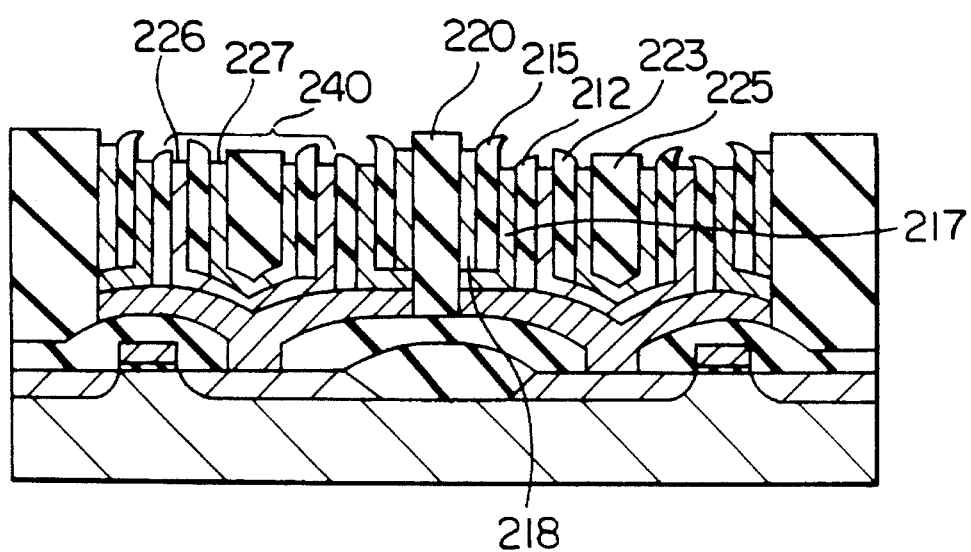
Figure 7:
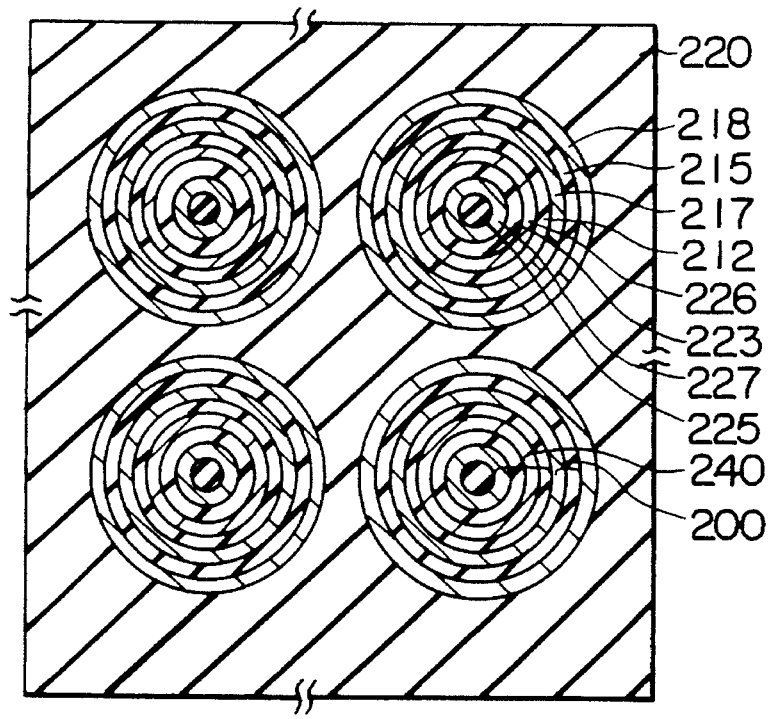
FIG. 7 is a plan view showing the process step of FIG. 4N.

From this condition, as shown in FIG. 4N, anisotropic etching is performed for the third polycrystalline silicon layer 221 and the fourth polycrystalline silicon layer 224 for exposing the upper portions of the first spacer 212, the second spacer 215, the third spacer 220, the fourth spacer 223 and the fifth spacer 225. Through this process, a third cylindrical electrode 226 and a fourth cylindrical electrode 227 are formed respectively from the third polycrystalline silicon layer 221 and the fourth polycrystalline silicon layer 224. By this, an internal coaxially arranged cylindrical electrode body 240 is formed within a position where the core members 209 and 210 were present. The plan view of the state at the process step of FIG. 4M is illustrated in FIG. 7.

At this condition, by employing a hot phosphoric acid, the first, second, third, fourth and fifth spacers 212, 215, 220, 223 and 225 of silicon nitride layers are removed simultaneously by wet etching. Then, over the entire surface including the surfaces of the side walls of the cylindrical electrodes, a silicon nitride layer or a capacitor insulation layer 228 formed by thermal oxidation of the silicon nitride layer is formed.

Figure 4O:
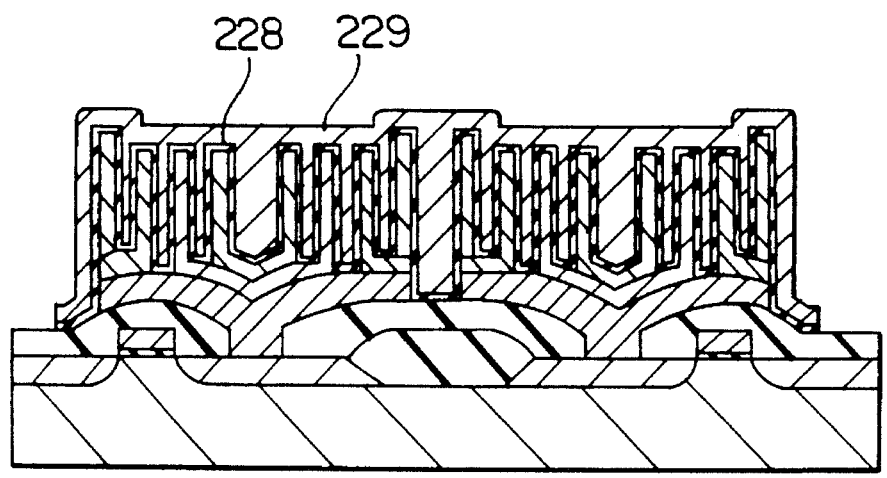

Furthermore, by the CVD method, a conductive polycrystalline silicon layer is formed over the capacitor insulation layer 228, as shown in FIG. 4O. Then, by performing dry etching employing the RIE technology for the polycrystalline silicon layer, an upper electrode 229 is formed. Thus, a capacitor having four coaxial cylindrical electrodes can be formed.

Figure 9:
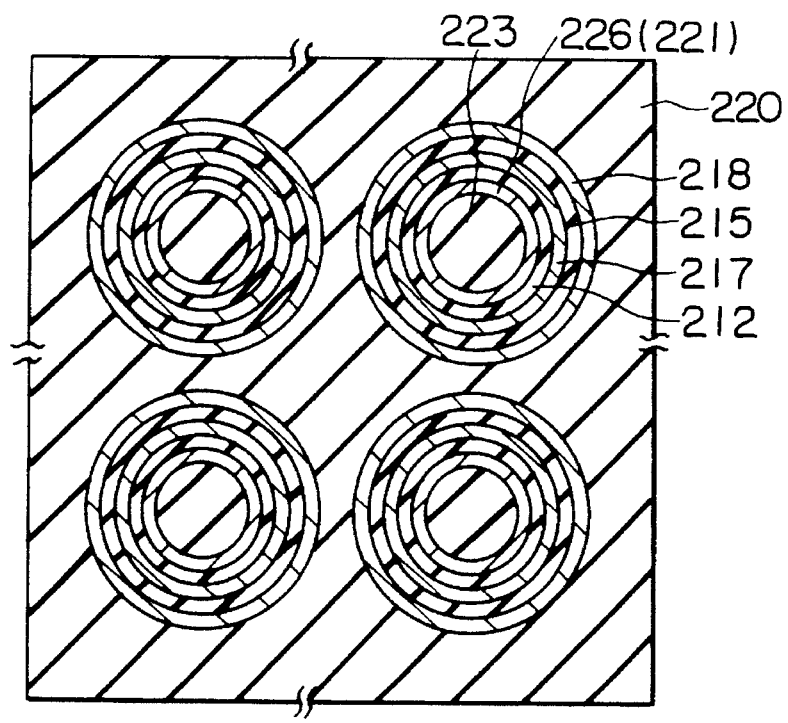
FIG. 9 is a plan view showing the process step of FIG. 8B.
Figure 8A:
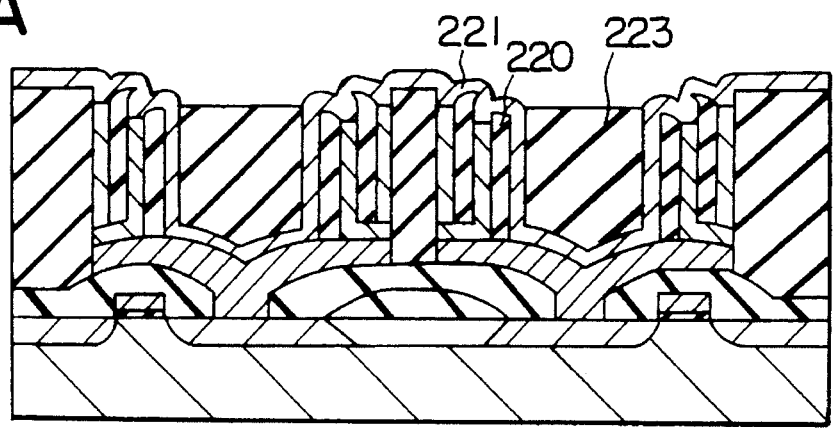
FIGS. 8A to 8C are sections showing process steps in the second embodiment of the semiconductor device fabrication process according to the present invention, subsequent to the process step of FIG. 4J.
Figure 8B:
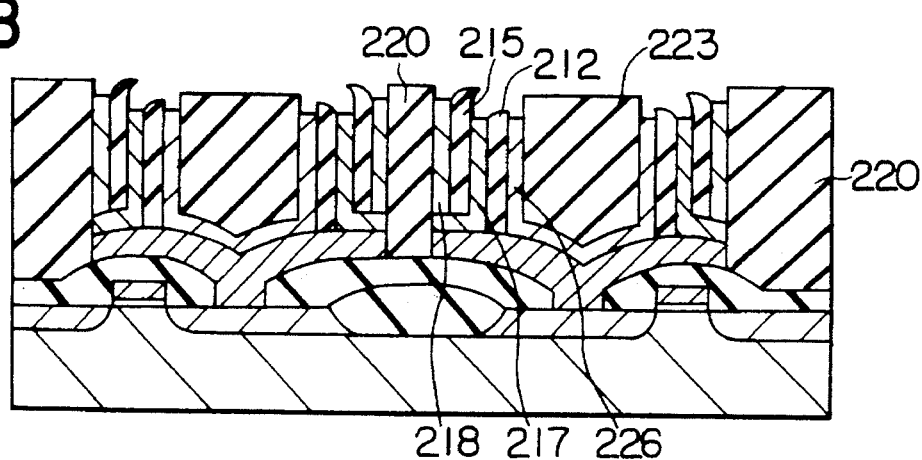
Figure 8C:
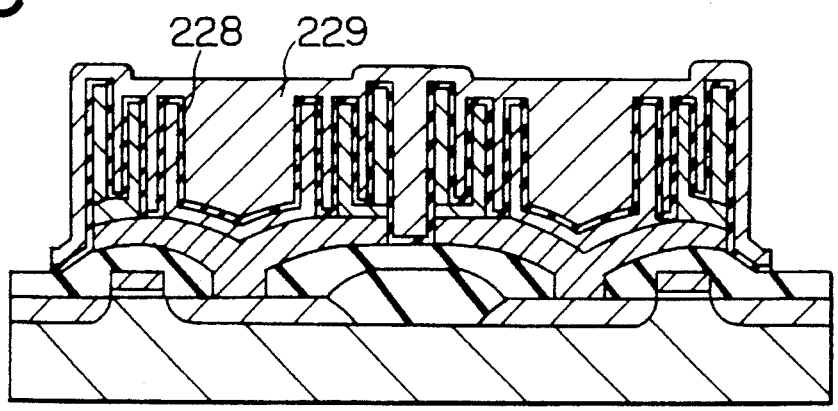

Next, discussion will be given for the second embodiment of the semiconductor device fabrication process according to the present invention, with reference to FIGS. 8A to 8C and 9. FIGS. 8A to 8C are sections of two memory cells and FIG. 9 is a plan view of four memory cells.

It should be noted that the fabrication process steps up to the process step of FIG. 4J are the same as those in the foregoing first embodiment. The second embodiment is differentiated from the first embodiment in the construction of the internal coaxially arranged cylindrical electrode body.

At first, in this second embodiment, subsequent to the process step of FIG. 4J, as shown in FIG. 8A, the fourth spacer 223 of the silicon nitride layer is formed to completely bury the vertical portion of the conductive third polycrystalline silicon layer 221 by employing etching back technology, similarly to the process for forming the third spacer 220.

Then, as shown in FIG. 8B, anisotropic etching is performed for the third polycrystalline silicon layer 221 by employing the RIE technology to expose the upper portions of the first, second and third spacers 212, 215 and 220. Then, the third cylindrical electrode 226 is formed from the third polycrystalline silicon layer 221. The plan view of the process step of FIG. 8B is illustrated in FIG. 9.

At this condition, the first, second, third and fourth spacers 212, 215, 220 and 223 of silicon nitride layers are removed by wet etching with hot phosphoric acid, simultaneously.

Subsequently, over the entire surface including the surfaces of the side walls of the cylindrical electrodes, a silicon nitride layer or a capacitor insulation layer 228 formed by thermal oxidation of the silicon nitride layer is formed.

Furthermore, by the CVD method, a conductive polycrystalline silicon layer is formed over the capacitor insulation layer 228. Then, by performing dry etching employing the RIE technology for the conductive polycrystalline silicon layer, an upper electrode 229 is formed as shown in FIG. 8C. Thus, a capacitor having three coaxial cylindrical electrodes can be formed.

As set forth above, with the fabrication method according to the present invention, since the spacer, i.e. core silicon oxide layer 209 used for forming the cylindrical electrodes, is removed and then the further cylindrical electrodes are formed in place of the spacer, the portion where the cylindrical electrode cannot be formed in the conventional fabrication process, can be used as the capacity portion constituted of the cylindrical electrode to permit increasing the capacity of the capacitor.

Also, while the foregoing first embodiment takes the process to initially form the outer two cylindrical electrodes outside of the core silicon oxide layer 209, to subsequently remove the core silicon oxide layer 209, and further two cylindrical electrodes are formed within the portion, from which the core silicon oxide layer 209 is removed, namely the inside of the outer two cylindrical electrodes, it is possible to form more than two cylindrical electrodes at respective ones of the outer position and inner position by making the thicknesses of the spacer and the cylindrical electrode thinner. Therefore, more than four coaxially arranged cylindrical electrodes can be easily formed.

As set forth above, according to the present invention, the central spacer to be used as a core for forming the conventional cylindrical electrodes is removed after formation of one or more outer cylindrical electrodes are formed so that one or more cylindrical electrodes may be formed within the space where the spacer is removed.

Therefore, the portion which cannot be used as the capacity portion in the conventional cylindrical electrodes can be utilized as the capacity portion to increase the capacitance of the capacitor. Also, in the process of forming the inner side cylindrical electrodes, the already formed cylindrical electrodes and the spacers formed therebetween are utilized as a united large spacer so that the spacer formed by only the silicon oxide layer as in the prior art illustrated in FIGS. 1A to 1J is not required, but the outer side cylindrical electrodes can be used as the spacer for forming the inner side cylindrical electrodes.

On the other hand, in the method to form the cylindrical electrodes in the spacer located at the coaxial center in the prior art as illustrated in FIGS. 2A to 2K, it is inherent to reduce the thickness of the spacer to a minimum dimension. It is quite difficult or even impossible to perform such processing with patterning by photo-lithographic technology or etching with RIE technology. Furthermore, the processed configuration inherently becomes a tapered configuration which borders formation of multi-cylindrical electrodes with a large number of cylindrical electrodes.

In contrast to this, according to the present invention, since the spacer formed at the coaxial center may be provided sufficient size to permit formation of a plurality of the cylindrical electrodes in the layer stage of fabrication process, it becomes possible to avoid the problem which can be caused by reduction of the thickness of the spacer to the minimum dimension.

As set forth above, according to the present invention, after formation of the largest possible number of cylindrical electrodes at the outside of the spacer, the electrodes can be formed within the center portion where the core is not removed to permit increasing the capacity of the capacitor.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments and equivalents thereof with respect to the features set out in the appended claims.

What is claimed is:

1. A fabrication process for a semiconductor device comprising the steps of:

forming a projecting core member of a lower electrode layer provided on the surface of an insulation layer on a semiconductor substrate;

forming outer electrode bodies by alternately forming spacer layers and conductive layers on the outer wall of said core member, and forming cylindrical electrodes extending from said lower electrode layer from said conductive layers and spacers between said cylindrical electrodes from said spacer layers, by anisotropic etching;

forming a spacer region so as to fill a clearance between adjacent outer electrode bodies;

removing said core member;

forming inner electrode bodies by alternately forming spacer layers and conductive layers on the inner wall of said outer electrode bodies at a portion where said core member is removed, and forming cylindrical electrodes extending from said lower electrode layer from said conductive layers and spacers between said cylindrical electrodes from said spacer layers, by anisotropic etching, to thereby form a lower electrode with said lower electrode layer, said outer electrode bodies and said inner electrode bodies;

removing spacers from said outer and inner electrode bodies; and forming a capacitor insulation layer over the exposed surfaces of said lower electrode including said lower electrode layer and said cylindrical electrodes, and forming an upper electrode over said capacitor insulation layer to form a capacitor.

2. A fabrication process for a semiconductor device as set forth in claim 1, wherein the process for forming said outer electrode bodies comprises the steps of:

after forming a first spacer layer over said core member and said lower electrode layer, performing anisotropic etching for said first spacer layer for leaving said first spacer layer only on the vertical side wall of said core member to form a first spacer;

forming a first conductive layer over said core member, said lower electrode layer and said first spacer;

after forming a second spacer layer over the entire surface of said first conductive layer, performing anisotropic etching for said second spacer layer for leaving said second spacer layer only on the vertical side wall of said first conductive layer to form a second spacer;

after forming a second conductive layer over the surfaces of said second spacer and said first conductive layer, performing anisotropic etching for said first and second conductive layers and said lower electrode layer until said insulation layer is exposed for forming a first cylindrical electrode from said first conductive layer and a second cylindrical electrode from said second conductive layer.

3. A fabrication process for a semiconductor device as set forth in claim 2, wherein the process for forming said inner electrode bodies comprises the steps of:

forming a third spacer on the exposed portion of said insulation layer in a height substantially equal to the height of said second cylindrical electrode;

after removing said core member by etching, forming a third conductive layer over the surfaces of said first and second cylindrical electrodes and said first to third spacers;

after forming a fourth spacer layer over the entire surface of said third conducive layer, performing anisotropic etching for said fourth spacer layer for leaving said fourth spacer layer only on the vertical portion of said third conductive layer positioned inside of the inner periphery of said outer electrode bodies for forming a fourth spacer;

forming a fourth conductive layer on the surfaces of said third conductive layer and said fourth spacer;

performing anisotropic etching for said third and fourth conductive layers until said first to fourth spacers are exposed to form a third cylindrical electrode from said third conductive layer and a fourth cylindrical electrode from said fourth conductive layer.

4. A fabrication process for a semiconductor device as set forth in claim 2, wherein the process for forming said inner electrode bodies comprises the steps of:

forming a third spacer on the exposed portion of said insulation layer in a height substantially equal to the height of said second cylindrical electrode;

after removing said core member by etching, forming a third conductive layer over the surfaces of said first and second cylindrical electrodes and said first to third spacers;

forming a fourth spacer for completely burying the side wall at the vertical portion of said third conductive layer positioned on the inner periphery of said outer electrode bodies;

performing anisotropic etching for said third conductive later until said first to third spacers are exposed to form a third cylindrical electrode from said third conductive layer.

5. A fabrication process for a semiconductor device as set forth in claim 1, wherein said lower electrode layer is connected to one of a source region and a drain region of a transistor formed on said semiconductor substrate, and said capacitor forms a DRAM cell together with said transistor.

6. A fabrication process for a semiconductor device as set forth in claim 1, wherein said core member is formed of a silicon oxide layer.

7. A fabrication process for a semiconductor device as set forth in claim 6, wherein a mask layer of a polycrystalline silicon layer is formed over said silicon oxide layer of said core member.

8. A fabrication process for a semiconductor device as set forth in claim 1, wherein said lower electrode layer and said conductive layers are formed of polycrystalline silicon.

9. A fabrication process as set forth in claim 1, wherein said spacer layer is formed of a silicon nitride layer.

10. A fabrication process as set forth in claim 1, wherein said core member is formed into a cylindrical configuration and said cylindrical electrodes are arranged coaxially.

11. A fabrication process for a semiconductor device comprising the steps of:

forming a projecting core member on a lower electrode layer provided on the surface of an insulation layer on a semiconductor substrate;

forming outer electrode bodies by alternately forming spacer layers and conductive layers on the outer wall of said core member, and by forming cylindrical electrodes extending from said lower electrode layer from said conductive layers and spacers between said cylindrical electrodes from said spacer layers, by anisotropic etching, said outer electrode bodies forming step including the steps of:

forming a first spacer layer over said core member and said lower electrode layer; performing anisotropic etching for said first spacer layer to leave said first spacer layer only on the vertical side wall of said core member thereby forming a first spacer;

forming a first conductive layer over said core member, said lower electrode layer and said first spacer;

forming a second spacer layer over the entire surface of said first conductive layer;

performing anisotropic etching for said second spacer layer to leave said second spacer layer only on the vertical side wall of said first conductive layer thereby forming a second spacer;

forming a second conductive layer over the surfaces of said second spacer and said first conductive layer;

performing anisotropic etching for said first and second conductive layers and said lower electrode layer until said insulation layer is exposed thereby forming a first cylindrical electrode from said first conductive layer and a second cylindrical electrode from said second conductive layer;

removing said core member;

forming inner electrode bodies by alternately forming spacer layers and conductive layers on the inner wall of said outer electrode bodies at a portion where said core number is removed, and by forming cylindrical electrodes extending from said lower electrode layer from said conductive layers and spacers between said cylindrical electrodes from said spacer layers, by anisotropic etching, to thereby form a lower electrode with said lower electrode layer, said outer electrode bodies and said inner electrode bodies;

removing spacers from said outer and inner electrode bodies; and forming a capacitor insulation layer over the exposed surfaces of said lower electrode including said lower electrode layer and said cylindrical electrodes, and forming an upper electrode over said capacitor insulation layer to form a capacitor.

* * * * *